United States Patent [19]

Wada et al.

[11] Patent Number: 5,030,529
[45] Date of Patent: Jul. 9, 1991

[54] CARBON ELECTRODE

[75] Inventors: Hiroshi Wada, Nara; Yoshikazu Yoshimoto, Tenri; Masaru Yoshida, Ikoma; Shigeo Nakajima, Nara, all of Japan

[73] Assignee: Sharp Kabushiki Kaisha, Osaka, Japan

[21] Appl. No.: 568,355

[22] Filed: Aug. 15, 1990

[30] Foreign Application Priority Data

Sep. 6, 1989 [JP] Japan ................................. 1-232577

[51] Int. Cl.$^5$ ............................................. H01M 4/02
[52] U.S. Cl. .................................... 429/209; 429/218
[58] Field of Search ............... 429/209, 218, 221, 223; 423/414, 445; 252/503; 428/408

[56] References Cited

U.S. PATENT DOCUMENTS 4,296,187 10/1981 Barnes et al. ........................ 429/105
4,339,322 7/1982 Balko et al. ........................ 429/38 X
4,777,083 10/1988 Ono et al. ........................ 429/209 X
4,960,655 10/1990 Hope et al. ........................ 429/209 X

OTHER PUBLICATIONS

Lobo et al., "Carbon Formation from Light Hydrocarbons on Nickel", *Journal of Catalysis*, 29 (1973), pp. 15–19.

Nishiyama et al., "Carbon Formation on Copper Nickel Alloys from Benzene", *Journal of Catalysis*, 33 (1974), pp. 98–107.

Japanese Published Unexamined Patent Application No. 24555/1988, with U.S. and EP Abstracts thereof.

Japanese Published Unexamined Patent Application No. 281673/1989, with Description from Derwent Data Base thereof.

*Primary Examiner*—Anthony Skapars
*Attorney, Agent, or Firm*—David G. Conlin; Ernest V. Linek

[57] ABSTRACT

A carbon electrode including a first carbon layer containing an iron family element formed by vapor pyrolytic deposition of a hydrocarbon compound and a second carbon layer free from any iron family element formed over the surface of said first carbon layer, which is useful in a secondary lithium battery and makes its capacity greater and self-discharge ratio lower.

4 Claims, 1 Drawing Sheet

CARBON ELECTRODE

BACKGROUND OF THE INVENTION

1. Field of the Invention

The present invention relates to an electrode for rechargeable batteries, and more particularly to a negative electrode for secondary lithium batteries.

2. Prior Art

Active research has been conducted in order to utilize graphitized carbon as an electrode for rechargeable batteries, since it has a layered structure and forms interlayer compounds with various materials. Especially, a carbon electrode as a negative electrode for secondary lithium batteries utilizing an interlayer compound formed with lithium is expected to materialize a high capacity negative electrode free from dendrite.

The inventors of the present invention have already discovered the fact that pyrolytic carbon is advantageous to be used as a carbon electrode for the above purpose (Japanese Published Unexamined Patent Application No. 24555/1988), and pyrolytic carbon containing an iron family element is especially advantageous (Japanese Published Unexamined Patent Application No. 281673/1989).

Although the pyrolytic carbon electrode containing an iron family element has a high charge density, the inventors of the invention have recently found that some kinds of such electrodes reduce in quantity of electric charge during conservation at room temperature, specifically more than 20% of self-discharge occurs. On the other hand, a self-discharge ratio of a secondary lithium battery having a negative electrode of lithium or lithium alloy is less than 1%. In comparing these self-discharge ratios, difference is so great that the graphitized carbon electrode cannot be put into practical use.

Accordingly, an object of the present invention is to minimize a self-discharge ratio of a carbon electrode.

SUMMARY OF THE INVENTION

In order to solve the above problem, the present invention provides a carbon electrode comprising a first carbon layer containing an iron family element formed by vapor pyrolytic deposition of a hydrocarbon compound and a second carbon layer free from any iron family element formed over the surface of said first carbon layer.

DETAILED DESCRIPTION OF THE PREFERRED EMBODIMENTS

Figure 1:
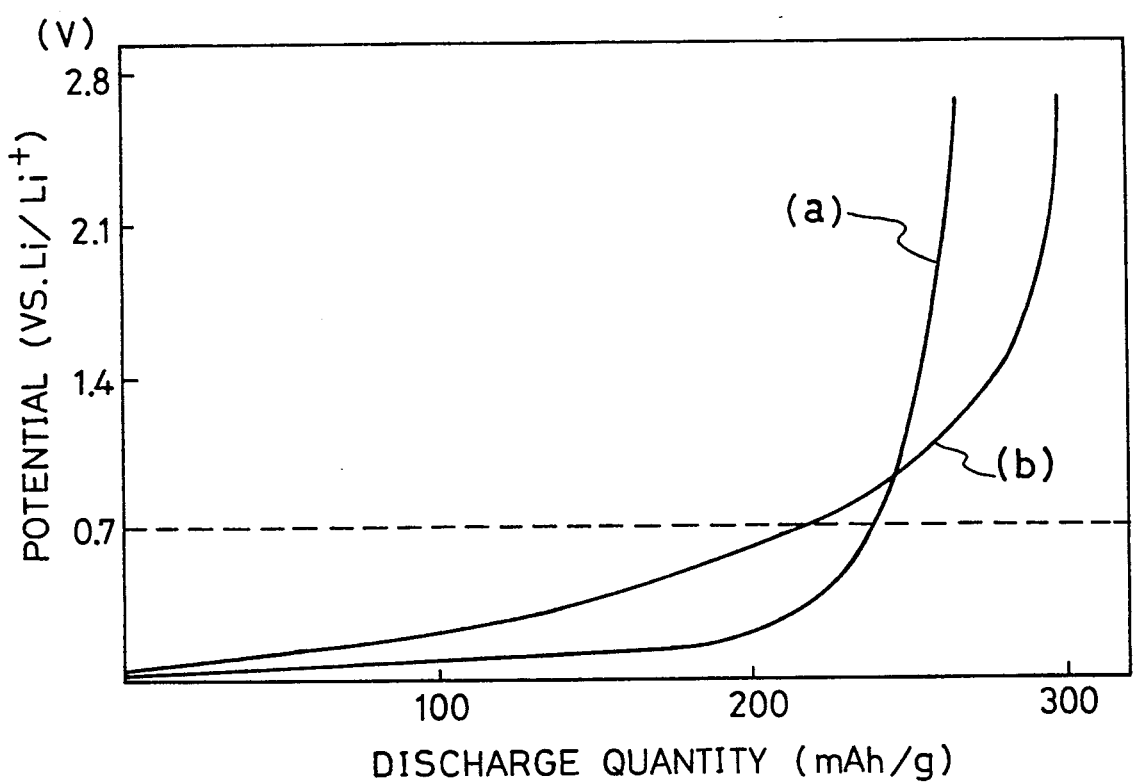
FIG. 1 is a graph showing discharge curves (a) and (b) of respective electrodes obtained in Example 1 and in Example 2.

The first carbon layer containing an iron family element is formed by vapor pyrolysis of a hydrocarbon compound such as propane, benzene and the like at 450–1300° C., for example, about 1000° C. to deposit carbon on a substrate containing the iron family element such as a Ni substrate, or to deposit carbon on fine powder containing the iron family element such as Ni and the like for forming carbon powder containing the iron family element, which is subsequently molded to form an electrode. Examples of the iron family element are Fe, Co, Ni and alloys of these elements. Among them, most preferable is Ni since the deposition rate of carbon on Ni is comparatively high, and further Ni is free from corrosion by an electrolyte used in secondary lithium batteries. It should be noted that the carbon deposition rate on Cu is low and that stainless steel becomes brittle when carbon is deposited thereon. Therefore, both materials are not suitable in this invention.

The carbon layer free from any iron family element is formed over the surface of the above first carbon layer. This formation can be performed using the above vapor pyrolysis with a higher concentration of evaporated hydrocarbon to increase the deposition rate. Alternatively, a resin coated over the first carbon layer may be carbonized by heating, or otherwise carbon may be vapor-deposited over the carbon layer. Among these methods, most preferable is the vapor pyrolysis.

In the carbon electrode structure of the invention, the iron family element contained in the first carbon layer is not necessarily homogeneous. For example, nearer to the surface of the electrode, content of the iron family element may decrease to zero at the surface thereof. Further, the electrode of the invention may be an aggregate of fine particles having the first carbon layer as a core layer and the second carbon layer coated thereover.

Intensive research by the inventors of the invention has resulted in the following findings.

A carbon substance formed by pyrolysis of the hydrocarbon compound utilizing catalysis of the iron family element is deposited at high rate, contains particles of the iron family element inside and at the surface thereof, and has a high charge density when used as a negative electrode of secondary lithium batteries. When the surface of an electrode made of such a carbon substance is analyzed by Auger electron spectroscopy, and the amount of the iron family element existing there is measured, it is found that the electrode containing a greater amount of the iron family element at the surface thereof self-discharges more, comparing the amount of the element with self-discharge quantity. This is because the amount of the iron family element at the surface of an electrode differs one electrode from another that there is a difference in discharge quantity between the electrodes containing the same iron element.

In contrast, a pyrolytic carbon electrode formed without utilizing catalysis of the iron family element self-discharges less relative to the above carbon electrode, although its charge density is lower. Further, if a carbon electrode having the iron family element in abundance at the surface thereof and self-discharging much is covered with pyrolytic carbon free from the iron family element, it self-discharges a little. This means that self-discharge ratio of the carbon electrode containing the iron family element depends on the amount of the iron family element existing at the surface thereof and does not depend on the amount of the iron family element existing inside thereof.

Thus, in the carbon electrode according to the invention, the first carbon layer containing the iron family element acts to make charge density higher while the second carbon layer free from the iron family element acts to decrease in self-discharge ratio, resulting in an electrode whose charge density is high and self-discharge ratio is low. Further, action of decreasing in self-discharge ratio effects sufficiently provided that the outer carbon layer does not contain the iron family element. Besides, if the outer carbon layer is formed by pyrolysis of a hydrocarbon compound, it enjoys a higher charge density comparing with those formed by other methods, resulting in an electrode having a greater capacity as a whole.

The present invention will hereinafter be more fully described with reference to Examples and Comparative Examples which are not limitative of the invention.

EXAMPLES

Example 1

An electrode was formed by heating a Ni substrate to 1000° C. and depositing a carbon layer of 50 μm thick using propane as a carbon source. In this case, a propane concentration was maintained at 2% for the initial 2 hours and at 20% for the subsequent 10 minutes. For this concentration change, an argon gas was used as a diluting gas. An infrared image furnace was used to heat the substrate. When the Ni quantity at the surface of the carbon electrode was measured using Auger electron spectroscopy, Ni was not found. When the same measurement was performed at depths of 5 μm and 30 μm from the surface of the electrode, 10 at% and 30 at% of Ni were respectively found.

Charge and discharge test with respect to the above electrode was carried out using a lithium as a counter electrode in a propylene carbonate electrolyte containing 1 M/l of $LiClO_4$. As a result, 235 mAh/g of capacity density was obtained within the potential range of 0–0.7 V vs $Li/Li^+$, as shown in FIG. 1 (a). At this time, the current density was 0.4 mA/cm$^2$. This electrode was charged to 0 V vs $Li/Li^+$ with 0.4 mA/cm$^2$ of constant current, then conserved for a month. A self-discharge ratio of the electrode during this conservation was 6%.

Example 2

An electrode was formed by depositing a carbon layer of 41 μm thick on a Ni substrate under the same conditions as in Example 1 except that a propane concentration was maintained at 2% for the initial 1 hour and at 20% for the subsequent 1 hour. Measurement by the Auger electron spectroscopy revealed that Ni contents at the surface of the electrode and at depths of 15 μm and 30 μm from the surface thereof were 0 at%, 0 at% and 30 at%, respectively. A capacity density and a self-discharge ratio of this electrode measured under the same conditions were 216 mAh/g and 6%, respectively, as shown in FIG. 1(b).

Comparative Example 1

An electrode having a carbon layer of 47 μm thick was formed in the same manner as in Example 1 except that the step of maintaining the propane concentration at 20% for 10 minutes was omitted. Measurement by the Auger electron spectroscopy revealed that Ni contents at the surface of the electrode and at the depth of 30 μm from the surface thereof were 8 at% and 28 at%, respectively. A capacity density and a self-discharge ratio of the electrode measured under the same conditions as in Example 1 were 240 mAh/g and 20%, respectively. In addition, adhesion of the carbon layer to the substrate was poor comparing with that of the electrode formed in Example 1.

Comparative Example 2

An electrode having a carbon layer of 30 μm thick was formed in the same manner as in Example 1 except that the propane concentration was maintained at 20 % for 2 hours. Measurement by the Auger electron spectroscopy revealed that Ni contents at the surface of the electrode and at the depth of 25 μm from the surface thereof were both 0 at%. A capacity density and a self-discharge ratio of the electrode measured under the same conditions as in Example 1 were 200 mAh/g and 5%, respectively. In addition, a plateau portion of the discharge curve was small.

As has been described above, the electrode according to the invention is useful as a negative electrode in secondary lithium batteries having a high capacity density and a low self-discharge ratio, thereby enabling to manufacture a highly improved secondary lithium battery. In addition, decrease in yield due to high self-discharge ratio can be avoided by virtue of the electrode of the invention, thereby contributing to a price reduction of batteries.

What is claimed is:

1. A carbon electrode comprising a first carbon layer containing an iron family element formed by vapor pyrolytic deposition of a hydrocarbon compound and a second carbon layer free from any iron family element formed over the surface of said first carbon layer.

2. The carbon electrode as set forth in claim 1, wherein the iron family element contained in said first carbon layer is Ni.

3. The carbon electrode as set forth in claim 1, wherein a content of said iron family element in said first layer becomes less in a portion nearer to the surface thereof.

4. The carbon electrode as set forth in claim 1, which is applied to a negative electrode for secondary lithium batteries.

* * * * *